United States Patent
Deng

(10) Patent No.: US 11,908,801 B2
(45) Date of Patent: Feb. 20, 2024

(54) CONNECTING COMPONENT, DISPLAY PANEL, AND DISPLAY DEVICE

(71) Applicant: Shenzhen China Star Optoelectronics Semiconductor Display Technology Co., Ltd., Shenzhen (CN)

(72) Inventor: Chuanghua Deng, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/276,160

(22) PCT Filed: Dec. 30, 2020

(86) PCT No.: PCT/CN2020/141671
§ 371 (c)(1),
(2) Date: Mar. 15, 2021

(87) PCT Pub. No.: WO2022/134173
PCT Pub. Date: Jun. 30, 2022

(65) Prior Publication Data
US 2023/0317622 A1  Oct. 5, 2023

(30) Foreign Application Priority Data
Dec. 24, 2020 (CN) .......................... 202011543628.8

(51) Int. Cl.
H01L 23/538 (2006.01)
H01L 25/16 (2023.01)
H05K 1/11 (2006.01)
H01L 23/42 (2006.01)

(52) U.S. Cl.
CPC .......... *H01L 23/5385* (2013.01); *H01L 23/42* (2013.01); *H01L 23/5387* (2013.01); *H01L 25/167* (2013.01); *H05K 1/11* (2013.01)

(58) Field of Classification Search
CPC ... H05K 1/11; H01L 23/42–538; G09F 9/302; G09F 9/33; H10K 59/1315
See application file for complete search history.

(56) References Cited

FOREIGN PATENT DOCUMENTS

| CN | 107402466 A | 11/2017 |
|---|---|---|
| CN | 108777114 A | 11/2018 |
| CN | 109036124 A | 12/2018 |
| CN | 109426018 A | 3/2019 |
| CN | 109521610 A | 3/2019 |
| CN | 110277018 A | 9/2019 |
| CN | 110277025 | * 9/2019 |

(Continued)

*Primary Examiner* — Wasiul Haider
(74) *Attorney, Agent, or Firm* — Nathan & Associates; Menachem Nathan

(57) ABSTRACT

A connecting component, a display panel, and a display device are provided. The connecting component includes a first plane and a second plane which are perpendicular to each other. The first plane is provided with a plurality of first terminals, the second plane is provided with a plurality of second terminals corresponding to the first terminals. Each of the first terminals is connected to a corresponding second terminal by a conducting wire. The connecting component may improve display effect of the display device formed by splicing the display panels, reducing risks of wiring breakage of a chip on flex (COF).

18 Claims, 3 Drawing Sheets

(56) References Cited

FOREIGN PATENT DOCUMENTS

| | | |
|---|---|---|
| CN | 110277025 A | 9/2019 |
| CN | 110286531 A | 9/2019 |
| CN | 110299393 A | 10/2019 |
| CN | 110579916 A | 12/2019 |
| CN | 110764323 A | 2/2020 |
| CN | 110967881 A | 4/2020 |
| CN | 111798756 A | 10/2020 |
| KR | 20190072877 A | 6/2019 |

* cited by examiner

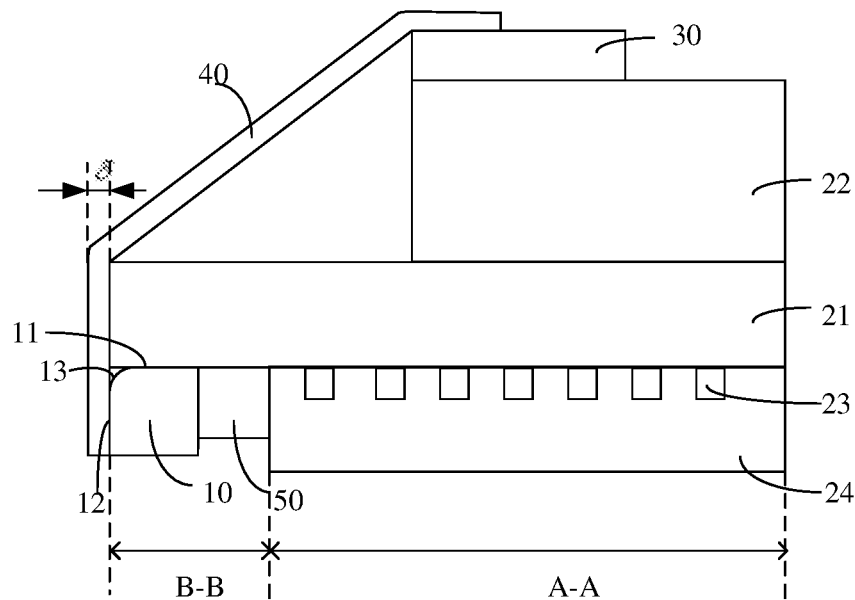

FIG. 5

| Providing a first plane, a PCB, a COF, and the connecting component of the above embodiments. Wherein, the first plane at least includes a substrate and a backplate, the backplate is disposed on a side of the substrate, and a surface of the substrate away from the backplate is divided into a display area and a bonding area. | S1 |

| Electrically connecting a plurality of first terminals on the first plane of the connecting component with the bonding area, making the second surface of the connecting component be aligned with a lateral surface of the substrate, electrically connecting an end of the COF with a plurality of second terminals on the second plane, and electrically connecting another end of the COF with the PCB. | S2 |

| Bending the COF along a direction toward the backplate, thereby fixing the PCB on the backplate. | S3 |

FIG. 6

CONNECTING COMPONENT, DISPLAY PANEL, AND DISPLAY DEVICE

FIELD

The present disclosure relates to the field of display technologies, and more particularly, to a connecting component, a display panel, and a display device.

BACKGROUND

Currently, mini light-emitting diodes (mini-LEDs) have been used in many fields, such as broadcasting, conference, and engineering, and have promising market potential. Spliced mini-LED display panels, which are developed based on mini-LEDs, are formed by splicing multiple mini-LEDs. The spliced min-LED display panels can achieve display requirements in different sizes according to different situations. Because the mini-LED display panels are easy to be produced and have low production costs, production efficiency and costs of the mini-LED panels may be reduced by splicing the mini-LED panels to form a module. Moreover, by the above arrangement, maintenance and transportation costs of the mini-LED panels may also be reduced.

FIG. 1 is a structural schematic view showing a conventional mini-LED display panel. As shown in FIG. 1, the conventional mini-LED display panel includes: a substrate 210, a backplate 220, a chip on flex (COF) 400, and a printed circuit board (PCB) 300. The backplate 220 is disposed on a side of the substrate 210. A surface of the substrate 210 away from the backplate 220 is divided into a display area A-A and a bonding area B-B. The COF 400 is disposed on the side of the substrate 210 away from the backplate 220. One end of the COF 400 is electrically connected to the bonding area, and another end of the COF 400 is electrically connected to the PCB 300.

To splice multiple mini-LED display panels to each other, each of the mini-LED display panels must be bent. Specifically, the COF 400 is bent along a direction toward the backplate 220, thereby fixing the PCB 300 on a side of the backplate 220 away from the substrate 210. FIG. 2 is a structural schematic view showing a bent mini-LED display panel. As shown in FIG. 2, a relatively large deformation is generated at a connecting part between the COF 400 and the bonding area, and a protrusion structure with a thickness δ is generated on a lateral side of the substrate 210. Wherein, δ=δ1+δ2, δ1 is a thickness of the COF 400, and δ2 is a thickness of a cavity area formed between the COF 400 and the substrate 210.

As shown in FIG. 2, the thickness δ of the protrusion structure is affected when the PCB 300 is fixed on the backplate 220. Specifically, if the PCB 300 is disposed more to left, pulling forces applied to the COF 400 by the PCB 300 will be less, leading to an increase of the thickness δ. Consequently, display effect of the spliced mini-LED display panels will be bad. On the contrary, if the PCB 300 is disposed more to right, pulling forces applied to the COF 400 by the PCB 300 will be greater, leading to serious deformation of the bent COF 400. As a result, risks of wiring breakage of the COF 400 will increase. Furthermore, since the cavity area always exists in the structure, serious deformation of bent COF 400 caused by collision may occur during splicing processes because of overly large applied forces or too many splicing times. As a result, risks of wiring breakage of the COF 400 will increase.

SUMMARY

Embodiments of the present disclosure provide a connecting component, a display panel, and a display device to solve a following problem: in conventional display devices formed by splicing multiple display panels, display effect is bad and risks of wiring breakage of a COF in the display panels are high.

In a first aspect, an embodiment of the present disclosure provides a connecting component, including a base body, wherein the base body includes a first outer surface, the first outer surface at least includes a first plane and a second plane which are perpendicular to each other, the first plane is provided with a plurality of first terminals, the second plane is provided with a plurality of second terminals, the first terminals and the second terminals are in one-to-one correspondence, and each of the first terminals is connected to a corresponding second terminal by a conducting wire.

In some embodiments, the conducting wire is disposed on the first outer surface and extends along a direction from the first plane to the second plane.

In some embodiments, the first outer surface further includes a curved surface respectively connected to the first plane and the second plane.

In some embodiments, a material of the base body is insulating, and a thermal expansion coefficient of the base body ranges from $1\times10^{-7}/K$–$500\times10^{-7}/K$.

In a second aspect, an embodiment of the present disclosure provides a display panel, including:
- a first panel, a printed circuit board (PCB), a chip on film (COF), and the connecting component of the first aspect;
- wherein the first plane at least includes a substrate and a backplate disposed on a side of the substrate, and a surface of the substrate away from the backplate is divided into a display area and bonding area;
- the printed circuit board is disposed on the side of the backplate away from the substrate;
- the first terminals on the first plane of the connecting component are electrically connected to the bonding area, and the second plane of the connecting component is aligned with a lateral surface of the substrate; and
- an end of the COF is electrically connected to the second terminals on the second plane, and another end of the COF is electrically connected to the PCB.

In some embodiments, the conducting wire is disposed on the first outer surface and extends along a direction from the first plane to the second plane.

In some embodiments, the first outer surface further includes a curved surface respectively connected to the first plane and the second plane. In some embodiments, the first outer surface further includes a curved surface respectively connected to the first plane and the second plane.

In some embodiments, a material of the base body is insulating, and a thermal expansion coefficient of the base body ranges from $1\times10^{-7}/K$ to $500\times10^{-7}/K$.

In some embodiments, the display panel further includes:
- a luminescent layer, a protective adhesive, and an anisotropic conductive adhesive film;
- wherein the luminescent layer is disposed on a side of the substrate away from the backplate, corresponds to the display area, and includes a plurality of light-emitting units;
- the protective adhesive is disposed on the side of the substrate away from the backplate, corresponds to the display area, and covers the luminescent layer;
- the anisotropic conductive adhesive film is disposed between the first plane and the bonding area, between the second plane and the COF, and between the COF and the PCB.

In some embodiments, the substrate further includes a second outer surface connected to the first outer surface, and the display panel further includes a fixing adhesive disposed between the second outer surface and the bonding area.

In some embodiments, the second outer surface and the first outer surface constitute the base body with a cuboid shape, a length of the first plane is less than or equal to a length of the bonding area, a height of the second plane is less than or equal to a height of the protective adhesive, and a width of the first plane and a width of the second plane are greater than or equal to a width of the COF.

In a third aspect, an embodiment of the present disclosure provides a display device, formed by a plurality of display panels spliced to each other.

In some embodiments, the conducting wire is disposed on the first outer surface and extends along a direction from the first plane to the second plane.

In some embodiments, the first outer surface further includes a curved surface respectively connected to the first plane and the second plane. In some embodiments, the first outer surface further includes a curved surface respectively connected to the first plane and the second plane.

In some embodiments, a material of the base body is insulating, and a thermal expansion coefficient of the base body ranges from $1 \times 10^{-7}$/K to $500 \times 10^{-7}$/K.

In some embodiments, the display panel further includes:
a luminescent layer, a protective adhesive, and an anisotropic conductive adhesive film;
wherein the luminescent layer is disposed on a side of the substrate away from the backplate, corresponds to the display area, and includes a plurality of light-emitting units;
the protective adhesive is disposed on the side of the substrate away from the backplate, corresponds to the display area, and covers the luminescent layer;
the anisotropic conductive adhesive film is disposed between the first plane and the bonding area, between the second plane and the COF, and between the COF and the PCB.

In some embodiments, the substrate further includes a second outer surface connected to the first outer surface, and the display panel further includes a fixing adhesive disposed between the second outer surface and the bonding area.

In some embodiments, the second outer surface and the first outer surface constitute the base body with a cuboid shape, a length of the first plane is less than or equal to a length of the bonding area, a height of the second plane is less than or equal to a height of the protective adhesive, and a width of the first plane and a width of the second plane are greater than or equal to a width of the COF.

Regarding the beneficial effects: embodiments of the present disclosure provide a connecting component, a display panel, and a display device. A plurality of first terminals on a first plane of the connecting component are electrically connected to a bonding area. A plurality of second terminals on a second plane of the connecting component are aligned with a lateral surface of the substrate. Two ends of a COF are respectively electrically connected to the second terminals on the second plane of the connecting component and a PCB. Therefore, a cavity area can be omitted from a lateral surface of a substrate without affecting transmission of signals. As a result, a thickness δ of a protrusion structure can be minimized. As such, not only can display effect of the display device, which is formed by splicing a plurality of display panels, be increased, but also risks of wiring breakage of the COF can be reduced.

DESCRIPTION OF DRAWINGS

FIG. 5 is a structural schematic view showing a display panel according to an embodiment of the present disclosure.

FIG. 6 is a flowchart showing a manufacturing method of the display panel according to an embodiment of the present disclosure.

DETAILED DESCRIPTION

Embodiments are further described below in detail with reference to accompanying drawings to make objectives, technical solutions, and effects of the present disclosure clearer and more precise. It should be noted that described embodiments are merely used to construct the present disclosure and are not intended to limit the present disclosure.

In some embodiment, for ease of description, a bent mini-LED display panel is referred as a display panel, a spliced mini-LED display panel formed by splicing a plurality of mini-LED display panels is referred as a display device.

To solve the above technical issue, an embodiment of the present disclosure provides a connecting component. The connecting component is used in the display panel and may reduce risks of wiring breakage of a COF in the display panel. Furthermore, the connecting component may improve display effect of the display device formed by splicing the display panels.

Figure 1:
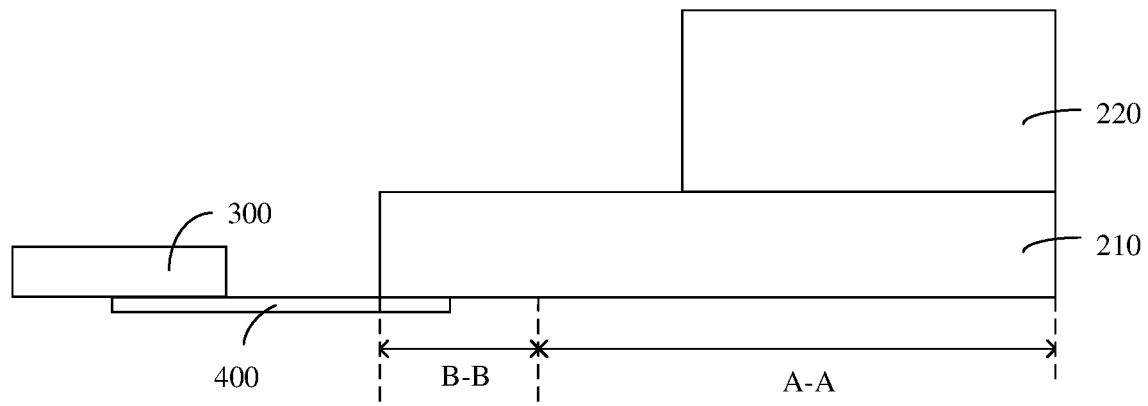
FIG. 1 is a structural schematic view showing a conventional mini-LED display panel.
Figure 2:
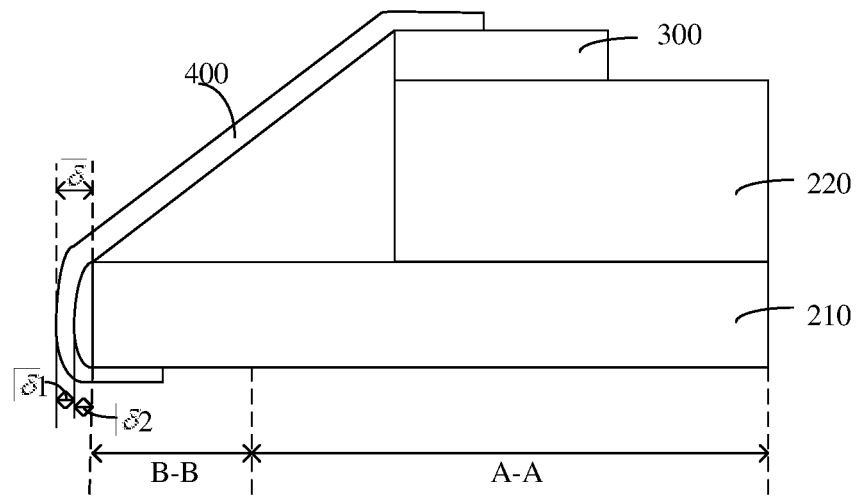
FIG. 2 is a structural schematic view showing the conventional mini-LED display panel after being bent.
Figure 3:
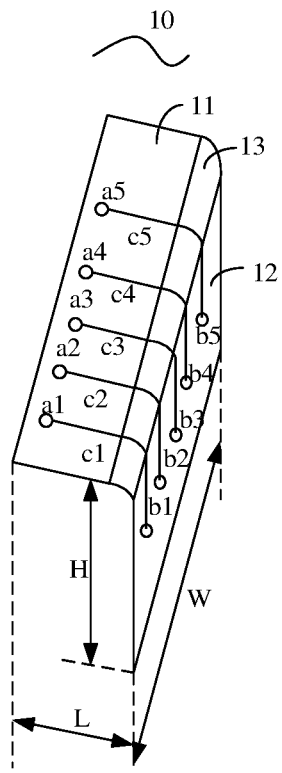
FIG. 3 is a structural schematic view showing a connecting component according to an embodiment of the present disclosure.

FIG. 3 is a structural schematic view showing the connecting component according to an embodiment of the present disclosure. As shown in FIG. 3, the connecting component 10 includes a base body. The base body includes a first outer surface. The first outer surface at least includes a first plane 11 and a second plane 12 which are perpendicular to each other.

The first plane 11 is provided with a plurality of first terminals. FIG. 3 shows five first terminals which are spaced apart from each other and are regularly arranged to form a straight line. It should be noted that the number and the arrangement of the first terminals as shown in FIG. 3 are only an example, and are not a limitation to embodiments of the present disclosure.

The second plane 12 is provided with a plurality of second terminals. FIG. 3 shows five second terminals which are spaced apart from each other and are regularly arranged to form a straight line. It should be noted that the number and the arrangement of the second terminals as shown in FIG. 3 are only examples, and are not a limitation to embodiments of the present disclosure.

It should be the first terminals and the second terminals are referred as terminals. In embodiments of the present disclosure, terminals not only may be conventional terminals, but also may be extremely short conducting wires. Terminals as shown in FIG. 3 are extremely short conducting wires and are coated on the first outer surface by coating processes, thereby obtaining thin-film-shaped terminals. The thin-film-shaped terminals have an advantage of lesser thickness that can reduce a size of the connecting component 10. Therefore, the thin-film-shaped terminals may be used in display panels of different sizes. Furthermore, because of the coating processes, the terminals and the first outer surface are attached to each other more fixedly. Thus, the terminals are prevented from peeling away from the connecting component 10 when the display device is used.

The first terminals on the first plane 11 and the second terminals on the second plane 12 are in a one-to-one correspondence. The first terminals and the second terminals are connected to each other by a conducting wire. The five first terminals as shown in FIG. 3 are extremely short conducting wires, namely a conducting wire a1, a conducting wire a2, a conducting wire 3, a conducting wire 4, and a conducting wire 5. The five second terminals are extremely short conducting wires, namely a conducting wire b1, a conducting wire b2, a conducting wire b3, a conducting wire b4, and a conducting wire b5. The conducting wire a1 and conducting wire b1 correspond to each other and are connected to each other by a conducting wire c1. The conducting wire a2 and conducting wire b2 correspond to each other and are connected to each other by a conducting wire c3. The conducting wire a4 and conducting wire b4 correspond to each other and are connected to each other by a conducting wire c4. The conducting wire a5 and conducting wire b5 correspond to each other and are connected to each other by a conducting wire c5.

Specifically, an end of the conducting wire is electrically connected to the first terminal, and another end of the conducting wire is electrically connected to the second terminal. Therefore, the first terminal may input signals into the second terminal by the conducting wire. Also, the second terminal may input signals into the first terminal by the conducting wire.

The conducting wire may be disposed on any position of the base body. FIG. 3 shows five conducting wires, namely the conducting wire c1, the conducting wire c2, the conducting wire c3, the conducting wire c4, and the conducting wire c5, respectively spaced apart from each other and disposed on the first outer surface. Each of the conducting wires extends along a direction from the first plane 11 to the second plane 12. Each of the conducting wires may be coated on the first outer surface by coating processes. Therefore, a plurality of thin-film-shaped terminals may be obtained. The thin-film-shaped terminals have an advantage of lesser thickness that can reduce a size of the connecting component 10. Therefore, the thin-film-shaped terminals may be used in display panels of different sizes. Furthermore, because of the coating processes, the terminals and the first outer surface are attached to each other more fixed, thereby preventing the terminals from peeling away from the connecting component 10 when display device is used.

It should be noted that the first terminal, the conducting wire, and the second terminal may be integrally formed or not, which is not limited to embodiments of the present disclosure.

Based on the above embodiments, in some embodiments, the first plane 11 is directly connected to the second plane 12. The first outer surface formed of the first plane 11 and the second plane 12 has a shape of right angle. In other embodiments, as shown in FIG. 3, the first outer surface further includes a curved surface 13 that is connected to the first plane 11 and the second plane 12, respectively. Thus, the first outer surface formed of the first plane 11, the curved surface 13, and the second plane 12 form an inverted triangle shape. Compared to the first outer surface with the shape of right angle, the first outer surface with the inverted triangle shape is not provided with a sharp corner. Therefore, risks of scratching the conducting wire coated on the first outer surface are reduced, and a yield rate of the conducting wire is increased.

In some embodiments, a material of the base body is an insulating material with relatively low thermal expansion coefficient generally ranging from $1\times10^{-7}$/K to $500\times10^{-7}$/K. The material of the base body may be plastic. Since the material of the base body has relatively low thermal expansion coefficient, changes in size are relatively slight when temperature changes. As a result, the display panel may have a relatively high yield rate at different temperatures.

Figure 4:
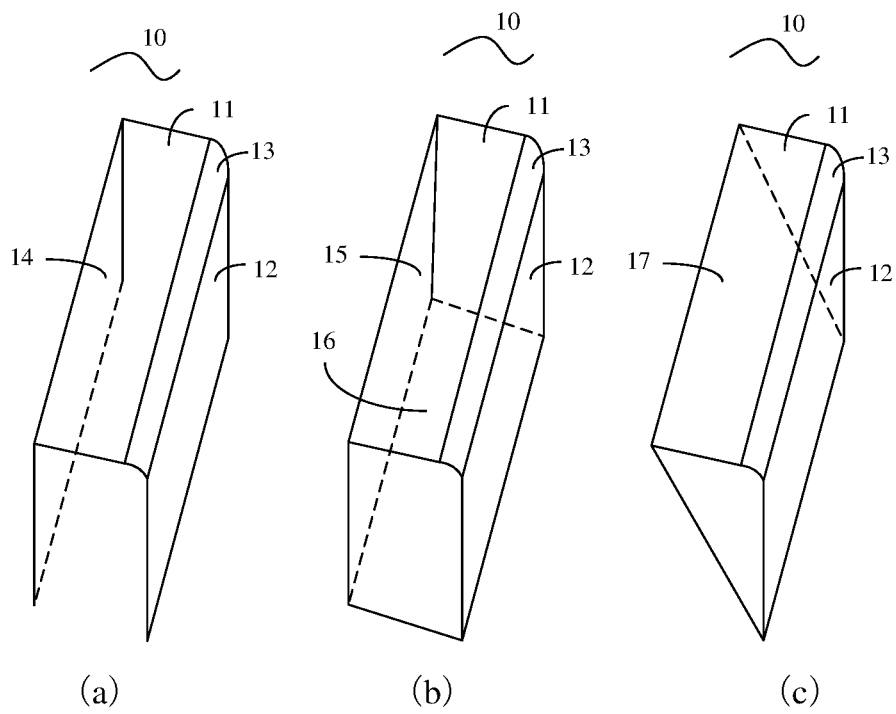
FIG. 4 is a structural schematic view showing a deformation structure of the connecting component according to an embodiment of the present disclosure.

Based on the above embodiments, FIG. 3 shows diverse deformation structures of the connecting component 10. FIG. 4 is a structural schematic view showing the deformation structure of the connecting component, wherein all connecting components 10 as shown in FIG. 4 have a second outer surface.

Specifically, as shown in FIG. 4(a), the second outer surface is a third plane 14. The third plane 14 is perpendicularly connected to the first plane 11 and corresponds to the second plane 12. In some embodiments, the second outer surface may further include other planes that form a closed structure together with the first outer surface and the third plane 14, which is not limited to embodiments of the present disclosure.

As shown in FIG. 4(b), the second outer surface is a fourth plane 15 and a fifth plane 16 which are perpendicularly connected to each other. The fourth plane 15 is perpendicularly connected to the first plane 11, and the fifth plane 16 is perpendicularly connected to the second plane 12. In some embodiments, the second outer surface may further include other planes that form a closed structure together with the first outer surface, the fourth plane 15, and the fifth plane 16, which is not limited by embodiments of the present disclosure.

As shown in FIG. 4(c), the second outer surface is a sixth plane 17 connected to the first plane 11 and the second plane 12, respectively. In some embodiments, the second outer surface may further include other planes that form a closed structure together with the first outer surface and the sixth plane 17, which is not limited by embodiments of the present disclosure.

The connecting component 10 is used in the display panel. The display panel including the connecting component 10 is described in detail as follows. FIG. 5 is a structural schematic view showing the display panel according to an embodiment of the present disclosure. As shown in FIG. 5, the display panel includes:

a first panel, a PCB 30, a COF 40, and the above-mentioned connecting component 10.

The COF 40 is fixing an integrated circuit (IC) on a flexible wiring board. Mostly, display panels, such as liquid crystal display (LCD) panels and organic light-emitting diode (OLED) display panels, include the COF 40. Generally, the COF 40 is configured to perform scan drive or data drive. That is, the COF 40 receives scan signals or data signals transmitted from the PCB 30, and transmits the received scan signals or data signals to a corresponding scan line or data line in the display panel. In embodiments of the present disclosure, the COF 40 is configured to perform data drive. That is, the COF 40 is only configured to receive data signals transmitted from the PCB 30, and transmits the received data signals to a corresponding data line in the display panel.

The first panel at least includes a substrate and a backplate. The substrate may be a rigid substrate such as a glass substrate. Also, the substrate may be a flexible substrate such as polyimide (PI) substrate. The backplate is disposed on a side of the substrate. A surface of the substrate away from the backplate is divided into a display area and a bonding area. The PCB 30 is disposed on a side of the backplate away from the substrate.

The connecting component 10 includes a base body. The base body includes a first outer surface. The first outer surface at least includes a first plane 11 and a second plane 12 which are perpendicular to each other. It should be noted that the connecting component 10 as shown in FIG. 5 further includes a curved surface 30 connected to the first plane 11 and second plane 12. The first plane 11 is provided with a plurality first terminals (not shown in FIG. 5, please refer to FIG. 3). The second plane 12 is provided with a plurality of second terminals (not shown in FIG. 5, please refer to FIG. 3). The first terminals and the second terminals are in a one-to-one correspondence, and each of the first terminals is connected to a corresponding second terminal by a conducting wire. The first terminals and the second terminals as shown in FIG. 5 are extremely short conducting wires. A conducting wire (not shown in FIG. 5, please refer to FIG. 3) connecting the first terminal with the second terminal is disposed on a first outer surface, and is integrally formed with the first terminal and the second terminal.

The first terminals on the first plane 11 of the connecting component 10 are electrically connected to the bonding area. The second surface 12 of the connecting component 10 is aligned with a lateral surface of the substrate. Specifically, all the data lines in the display area extend to the bonding area. The first terminals on the first surface 11 of the connecting component 10 and the data lines in the bonding area are in one-to-one correspondence and are electrically connected to each other. The second plane 12 of the connecting component 10 is aligned with the lateral surface of the substrate.

An end of the COF 40 is electrically connected to the second terminals on the second plane 12, and another end of the COF 40 is electrically connected to the PCB 30. Two ends of the COF 40 are respectively electrically connected to the PCB 30 and the second terminals on the second plane 12 of the connecting component 10. Therefore, the COF 40 may receive data signals transmitted from the PCB 30, and transmits the data signals to the second terminals on the second surface 12 of the connecting component 10. Then, the second terminals transmit the data signals to the first terminals electrically connected thereto, and the first terminals transmit the data signals to the data lines electrically connected thereto.

As shown in FIG. 5, the connecting component 10 is used in the display panel. The first terminals on the first plane 11 of the connecting component 10 are electrically connected to a bonding area. The second terminals on the second plane 12 of the connecting component 10 are aligned with the lateral surface of the substrate. Two ends of the COF 40 are respectively electrically connected to the second terminals on the second plane 12 of the connecting component 10 and the PCB 30. Therefore, a cavity area can be omitted from the lateral surface of the substrate without affecting transmission of signals. As a result, the thickness δ of the protrusion structure can be minimized. As such, not only can display effect of the display device, which is formed by splicing a plurality of display panels, be increased, but also risks of wiring breakage of the COF can be reduced.

In some embodiment, as shown in FIG. 5, the display panel further includes a luminescent layer 23, a protective adhesive 24, and an anisotropic conductive adhesive film (not shown in FIG. 5). The luminescent layer 23 is disposed on the side of the substrate away from the backplate, corresponds to the display area, and comprises a plurality of light-emitting units. Luminescent units in the luminescent layer 23 as shown in FIG. 5 are mini-LEDs. The mini-LEDs are spaced apart from each other. Each of the mini-LEDs may emit light having a certain color. The certain color may be red, green, or blue which are not limited to embodiments of the present disclosure.

The protective adhesive 24 is disposed on the side of the substrate away from the backplate, corresponds to the display area, and covers the luminescent layer 23. It should be noted that the protective adhesive 24 and the luminescent layer 23 are disposed on the same side of the substrate. The mini-LEDs in the luminescent layer 23 are spaced apart from each other. The protective adhesive 24 covers the mini-LEDs and fills intervals between different mini-LEDs. A thickness of the protective adhesive 24 is greater than a thickness of the mini-LEDs, thereby protecting the mini-LEDs from being damaged by external objects. Thus, an entire strength of the luminescent layer 23 may be improved. A material of the protective adhesive 24 is not limited to embodiments of the present disclosure.

The anisotropic conductive adhesive film is disposed between the first plane 11 and the bonding area, between the second plane 12 and the COF 40, and between the COF 40 and the PCB 30. Specifically, the anisotropic conductive adhesive film has an anisotropic conductive property. Therefore, if the anisotropic conductive adhesive film is disposed between the first surface 11 of the connecting component 10 and the bonding area, every first terminals on the first surface 11 may be electrically connected to corresponding data lines in the bonding area. If the anisotropic conductive adhesive film is disposed between the second plane 12 of the connecting component 10 and the COF 40, every second terminals on the second plane 12 may be electrically connected to corresponding conducting wires on the COF 40. If the anisotropic conductive adhesive film is disposed between the COF 40 and the PCB 30, the COF 40 may be electrically connected to the PCB 30. It should be understood that the anisotropic conductive adhesive film may realize electrical connection between different objects and is convenient and easy to be used.

In some embodiments, the base body further includes a second outer surface. Specifically, please refer to FIG. 4, the second outer surface is connected to the first outer surface. The display panel further includes a fixing adhesive 50 disposed between the second outer surface and the bonding area. A material of the fixing adhesive 50 may be an epoxy adhesive, a phenolic adhesive, or an organic silicone adhesive, which are not limited to embodiments of the present disclosure.

It should be understood that the fixing adhesive 50 may further ensure that the connecting component 10 is firmly fixed on the substrate 21, and ensure that enough pulling forces can be applied to the COF 40 when the PCB 30 is fixed on the backplate. Therefore, the COF 40 may be tied firmly and may be prevented from large shaking.

In some embodiments, the second outer surface and the first outer surface of the base body of the connecting component 10 constitute a cuboid, as shown in FIG. 5. Please refer to FIG. 3, a length L of the first plane 11 is less than or equal to a length of the bonding area. A height of the second plane 12 is less than or equal to a height of the protective adhesive. Therefore, the connecting component 10 would not protrude after being mounted. A width of the first plane 11 and a width of the second plane 12 are greater than or equal to a width of the COF 40.

Please refer to FIG. 6, FIG. 6 shows a flowchart of a manufacturing method of the display panel provided by embodiments of the present disclosure. The method includes following steps:

Step S1, providing a first plane, a PCB, a COF, and the connecting component of the above embodiments. The first plane at least includes a substrate and a backplate, the backplate is disposed on a side of the substrate, and a surface of the substrate away from the backplate is divided into a display area and a bonding area.

Step S2, electrically connecting a plurality of first terminals on the first plane of the connecting component with the bonding area, making the second surface of the connecting component be aligned with a lateral surface of the substrate, electrically connecting an end of the COF with a plurality of second terminals on the second plane, and electrically connecting another end of the COF with the PCB.

Step S3, bending the COF along a direction toward the backplate, thereby fixing the PCB on the backplate.

In some embodiments, the base body of the connecting component further includes a second outer surface connected to the first outer surface. The method further includes:

Step S4, filling a fixing adhesive between the second outer surface of the connecting component and the bonding area.

It should be noted the step S4 may be performed before or after the step S3, which is not limited by embodiments of the present disclosure.

It should be noted that a structure of the display panel manufactured by the above method is as shown in FIG. 5. A plurality of first terminals on a first plane of the connecting component are electrically connected to a bonding area. A plurality of second terminals on a second plane of the connecting component are aligned with a lateral surface of the substrate. Two ends of a COF are respectively electrically connected to the second terminals on the second plane of the connecting component and a PCB. Therefore, a cavity area can be omitted from a lateral surface of a substrate without affecting transmission of signals. As a result, a thickness δ of a protrusion structure can be minimized. As such, not only can display effect of the display device, which is formed by splicing a plurality of display panels, be increased, but also risks of breakage of the COF can be reduced.

In some embodiments, the first terminals and the second terminals are extremely short conducting wires. A conducting wire connecting the first terminal with the second terminal is disposed on a first outer surface, and is integrally formed with the first terminal and the second terminal. Specifically, the step S2 includes following steps: disposing an anisotropic conductive adhesive film between the first plane and the bonding area, thereby electrically connecting the first terminals on the first plane of the connecting component with the bonding area. Then, making the second plane of the connecting component be aligned with a lateral surface of the substrate, electrically connecting an end of the COF with the second terminals on the second plane, disposing an anisotropic conductive adhesive film between the COF and the PCB, and electrically connecting another end of the COF with the PCB.

An embodiment of the present disclosure further provides a display device formed by splicing the display panels of the above embodiments.

A plurality of first terminals on a first plane of the connecting component are electrically connected to a bonding area. A plurality of second terminals on a second plane of the connecting component are aligned with a lateral surface of the substrate. Two ends of a COF are respectively electrically connected to the second terminals on the second plane of the connecting component and a PCB. Therefore, a cavity area can be omitted from a lateral surface of a substrate without affecting transmission of signals. As a result, a thickness δ of a protrusion structure can be minimized. As such, not only can display effect of the display device, which is formed by splicing a plurality of display panels, be increased, but also risks of wiring breakage of the COF can be reduced.

In summary, many changes and modifications to the described embodiment can be carried out by those skilled in the art, and all such changes and modifications are intended to be included within the scope of the appended claims.

What is claimed is:

1. A connecting component, comprising a base body, wherein the base body comprises a first outer surface, the first outer surface at least comprises a first plane and a second plane which are perpendicular to each other, the first plane is provided with a plurality of first terminals, the second plane is provided with a plurality of second terminals, the first terminals and the second terminals are in one-to-one correspondence, and each of the first terminals is connected to a corresponding second terminal by a conducting wire.

2. The connecting component of claim 1, wherein the conducting wire is disposed on the first outer surface and extends along a direction from the first plane to the second plane.

3. The connecting component of claim 1, wherein the first outer surface further comprises a curved surface respectively connected to the first plane and the second plane.

4. The connecting component of claim 1, wherein a material of the base body is insulating, and a thermal expansion coefficient of the base body ranges from $1 \times 10^{-7}$/K to $500 \times 10^{-7}$/K.

5. A display panel, comprising:
a first panel, a printed circuit board (PCB), a chip on film (COF), and the connecting component of claim 1;
wherein the first plane at least comprises a substrate and a backplate disposed on a side of the substrate, and a surface of the substrate away from the backplate is divided into a display area and a bonding area;
the printed circuit board is disposed on a side of the backplate away from the substrate;
the first terminals on the first plane of the connecting component are electrically connected to the bonding area, and the second plane of the connecting component is aligned with a lateral surface of the substrate; and
an end of the COF is electrically connected to the second terminals on the second plane, and another end of the COF is electrically connected to the PCB.

6. The display panel of claim 5, wherein the conducting wire is disposed on the first outer surface and extends along a direction from the first plane to the second plane.

7. The display panel of claim 5, wherein the first outer surface further comprises a curved surface respectively connected to the first plane and the second plane.

8. The display panel of claim 5, wherein a material of the base body is insulating, and a thermal expansion coefficient of the base body ranges from $1\times10^{-7}$/K to $500\times10^{-7}$/K.

9. The display panel of claim 5, wherein the display panel further comprises:
- a luminescent layer, a protective adhesive, and an anisotropic conductive adhesive film;
- wherein the luminescent layer is disposed on a side of the substrate away from the backplate, corresponds to the display area, and comprises a plurality of light-emitting units;
- the protective adhesive is disposed on the side of the substrate away from the backplate, corresponds to the display area, and covers the luminescent layer; and
- the anisotropic conductive adhesive film is disposed between the first plane and the bonding area, between the second plane and the COF, and between the COF and the PCB.

10. The display panel of claim 9, wherein the substrate further comprises a second outer surface connected to the first outer surface, and the display panel further comprises a fixing adhesive disposed between the second outer surface and the bonding area.

11. The display panel of claim 10, wherein the second outer surface and the first outer surface constitute the base body with a cuboid shape, a length of the first plane is less than or equal to a length of the bonding area, a height of the second plane is less than or equal to a height of the protective adhesive, and a width of the first plane and a width of the second plane are greater than or equal to a width of the COF.

12. A display device, comprising a plurality of display panels of claim 5 spliced to each other.

13. The display device of claim 12, wherein the conducting wire is disposed on the first outer surface and extends along a direction from the first plane to the second plane.

14. The display device of claim 12, wherein the first outer surface further comprises a curved surface respectively connected to the first plane and the second plane.

15. The display device of claim 12, wherein a material of the base body is insulating, and a thermal expansion coefficient of the base body ranges from $1\times10^{-7}$/K to $500\times10^{-7}$/K.

16. The display device of claim 12, wherein the display panels further comprise:
- a luminescent layer, a protective adhesive, and an anisotropic conductive adhesive film;
- wherein the luminescent layer is disposed on a side of the substrate away from the backplate, corresponds to the display area, and comprises a plurality of light-emitting units;
- the protective adhesive is disposed on the side of the substrate away from the backplate, corresponds to the display area, and covers the luminescent layer; and
- the anisotropic conductive adhesive film is disposed between the first plane and the bonding area, between the second plane and the COF, and between the COF and the PCB.

17. The display device of claim 16, wherein the substrate further comprises a second outer surface connected to the first outer surface, and the display panel further comprises a fixing adhesive disposed between the second outer surface and the bonding area.

18. The display device of claim 17, wherein the second outer surface and the first outer surface constitute the base body with a cuboid shape, a length of the first plane is less than or equal to a length of the bonding area, a height of the second plane is less than or equal to a height of the protective adhesive, and a width of the first plane and a width of the second plane are greater than or equal to a width of the COF.

\* \* \* \* \*